United States Patent
Pagliaro, Jr. et al.

(10) Patent No.: US 6,620,743 B2
(45) Date of Patent: Sep. 16, 2003

(54) STABLE, OXIDE-FREE SILICON SURFACE PREPARATION

(75) Inventors: Robert H. Pagliaro, Jr., Penarth (GB); Mitchell L. Doty, Higley, AZ (US); Diane M. King, Cave Creek, AZ (US)

(73) Assignee: ASM America, Inc., Phoenix, AZ (US)

( * ) Notice: Subject to any disclaimer, the term of this patent is extended or adjusted under 35 U.S.C. 154(b) by 94 days.

(21) Appl. No.: 09/817,770

(22) Filed: Mar. 26, 2001

(65) Prior Publication Data

US 2003/0005944 A1 Jan. 9, 2003

(51) Int. Cl.$^7$ ................................ H01L 21/31
(52) U.S. Cl. ................ 438/787; 438/906; 438/753; 134/2; 134/3
(58) Field of Search ................ 438/787, 906, 438/748, 745, 749, 750, 753; 134/2, 3

(56) References Cited

U.S. PATENT DOCUMENTS

| | | | |
|---|---|---|---|
| 4,582,624 A | 4/1986 | Enjo et al. | |
| 4,856,544 A | 8/1989 | McConnell | |
| 4,885,056 A | 12/1989 | Hall et al. | |
| 4,899,767 A | 2/1990 | McConnell et al. | |
| 5,022,961 A | 6/1991 | Izumi et al. | |
| 5,051,134 A | 9/1991 | Schnegg et al. | |
| 5,308,400 A | * 5/1994 | Chen ........................ | 134/2 |
| 5,330,577 A | 7/1994 | Maeda et al. | |

(List continued on next page.)

FOREIGN PATENT DOCUMENTS

| | | |
|---|---|---|
| DE | 198 55 394 | 6/1999 |
| EP | 0 700 077 | 6/1996 |
| EP | 0 848 088 | 6/1998 |

OTHER PUBLICATIONS

G. Jonathan Kluth, et al "Oxidation mechanism of the ammonium fluoride treated Ai(100) surface" J. Appl. Phys. vol. 80, No. 9ppl 5408–5414 (Nov. 1996).*

Celik et al, *Low Thermal Budget Surface Preparation for Selective Epitaxy; A Study on Process Robustness*, Journal of The Electrochemical Society, 146 (4) 1557–1564 (1999).

Van der Heide et al., *Etching of thin $SiO_2$ layers using wet HF gas*, J. Vac. Sci. Technol. A., vol. 7, No. 3, 1719–1723, 1723 (1989).

Mende et al., *Oxidation Of Etched Silicon in Air at Room Temperature; Measurements with Ultrasoft X–Ray Photoelectron Spectroscopy (ESCA) and NeuronAcitvationAnalysis*, 128 Surface Sciences 169–175, 174 (1983).

Arnold Steinman, *Controlling Static Charge in Spin Rinser Dryers*, Semiconductor International, Aug. 1998, at 86.

T.Takahagi; et al., *The formation of hydrogen passivated silicon single–crystal surfaces using ultraviolet cleaning and HF etching*, J. Appl. Phys. 64(7): 3516–3521 (1988).

Maria A. Lester, *IMEC– Clean, RCA Replacement*, Semiconductor International, Aug. 2000, at 62.

E.D. Olson et al., *Alternatives to Standard Wet Cleans*, Semiconductor International, Aug. 2000, at 70–76.

Primary Examiner—Caridad Everhart
(74) Attorney, Agent, or Firm—Knobbe Martens Olson & Bear LLP

(57) ABSTRACT

Methods are provided for producing a hydrogen-terminated silicon wafer surface with high stability against oxidation. The silicon wafer is cleaned with ammonium hydroxide/hydrogen peroxide/water, etched with high purity, heated dilute hydrofluoric acid, rinsed in-situ with ultrapure water at room temperature, and is spin-dried with heat ionized purge gas. The stability of the surface of the silicon wafer is assured by optimizing to minimize particle addition at each step. The silicon wafer produced by the method is stable in a normal clean room environment for greater than 3 days and has been demonstrated to last without significant oxide regrowth for greater than 7 days.

32 Claims, 8 Drawing Sheets

U.S. PATENT DOCUMENTS

| | | |
|---|---|---|
| 5,454,901 A | 10/1995 | Tsuji |
| 5,464,480 A | 11/1995 | Matthews |
| 5,470,393 A | 11/1995 | Fukazawa |
| 5,509,970 A | 4/1996 | Shiramizu |
| 5,601,656 A | 2/1997 | Li |
| 5,656,097 A | 8/1997 | Olesen et al. |
| 5,665,168 A | 9/1997 | Nakano et al. |
| 5,679,171 A | 10/1997 | Saga et al. |
| 5,681,397 A | 10/1997 | Li |
| 5,759,971 A | 6/1998 | Manako |
| 5,783,495 A | 7/1998 | Li et al. |
| 5,810,940 A | 9/1998 | Fukazawa et al. |
| 5,814,157 A | 9/1998 | Mizuniwa et al. |
| 5,837,662 A | 11/1998 | Chai et al. |
| 5,904,574 A | 5/1999 | Nishijima |
| 5,908,509 A | 6/1999 | Olesen et al. |
| 5,932,022 A | 8/1999 | Linn et al. |
| 5,948,161 A | 9/1999 | Kizuki |
| 5,950,645 A | 9/1999 | Olesen et al. |
| 5,996,595 A | 12/1999 | Olesen et al. |
| 6,003,243 A * | 12/1999 | Ohmi ............................ 34/218 |
| 6,106,634 A | 8/2000 | Ghanayem et al. |
| 6,158,445 A * | 12/2000 | Olesen et al. ................. 134/1.3 |
| 6,319,331 B1 * | 11/2001 | Kume et al. .................... 134/3 |

* cited by examiner

STABLE, OXIDE-FREE SILICON SURFACE PREPARATION

BACKGROUND OF THE INVENTION

1. Field of the Invention

This invention relates to a method for forming a stable, oxide-free silicon surface that inhibits re-growth of an oxide layer for long periods of time in a clean room environment.

2. Description of the Related Art

Clean semiconductor surfaces are a key factor in preparing integrated circuits in high yields. There are two major types of contamination which occur: films and particulates. Particulates are materials that have readily defined boundaries, while films (for example, native oxide on a bare silicon surface) are layers of material on the surface of the wafer.

It is important to minimize or eliminate both films and particulates on the surface of the silicon wafer in order to optimize integrated circuit yields. Prior to epitaxial deposition and diffusion processes on bare silicon surfaces, particularly for processes conducted at less than about 850° C., it is important to have a clean oxide-free silicon surface.

Particulates and films may be removed through cleaning. The standard cleaning method often involves one or more forms of an RCA cleaning procedure. The RCA Standard-Clean-1 (SC-1) procedure uses a mixture of hydrogen peroxide, ammonium hydroxide, and water heated to a temperature of about 70° C. The SC-1 procedure dissolves films and removes Group I and II metals. The Group I and II metals are removed through complexing with the reagents in the SC-1 solution.

The RCA Standard-Clean-2 (SC-2) procedure utilizes a mixture of hydrogen peroxide, hydrochloric acid, and water heated to a temperature of about 70° C. The SC-2 procedure removes the metals that are not removed by the SC-1 procedure. If an oxide-free surface is required, the silicon wafer is dipped into an aqueous solution of hydrofluoric acid to etch away the oxide layer and, theoretically, obtain hydrogen termination. There are a large number of variations on RCA clean and hydrofluoric acid dips.

After cleaning, wafers are typically stored for a period of time before further processing. A native oxide tends to form on the oxide-free silicon surface almost immediately after exposure to air or moisture. Further, silicon-fluorine and silicon-carbon bonds are often observed on the silicon surface after cleaning. The fluorine and carbon contamination on the surface may be detrimental to the thermal budget and/or the quality of the layer to be grown or deposited on the surface of the wafer.

If the silicon wafer is dipped in hydrofluoric acid as the last cleaning step (also known as an "HF last" step), the surface of the silicon is typically terminated mostly with a monolayer of hydrogen, largely Si—H bonds. The hydrogen-terminated surface prevents oxidation better than without any termination. However, the surface of a silicon wafer after an HF last treatment normally starts to reoxidize within about 20 minutes after the original oxide layer was removed, quickly forming a new 5 Å to 7 Å thick oxide layer on the surface of the silicon wafer. Even with the best cleaning processes currently known, a layer of native oxide forms within 48 hours, and, often the wafers cannot be further processed within that time. This will mandate a new HF dip if an oxide-free surface is required for the next process step.

Carbon or fluorine termination can better prevent re-oxidation, but they introduce other problems, such as contamination or difficulty in removing the termination prior to subsequent processing. Hydrogen termination can advantageously be removed at about 500° C.

In an HF last, when the oxide layer is removed from the surface with a hydrofluoric acid solution as the final step in the cleaning procedure, the wafer surface has a tendency to have high levels of particles due to: 1) exposure to contaminants in the solution; 2) exposure to air at the air/liquid interface; 3) deposition of particles during the drying process; and 4) exposure to air during the time between the drying step and the time that the silicon wafer is placed in an inert environment.

Oxide regrowth on the surface of the cleaned wafer can be inhibited for longer periods of time by storing the wafers in an inert environment, such as a nitrogen or argon atmosphere. However, even the exposure to air during the time period between the time that the wafer is removed from the cleaning bath and the time that the wafer is placed in the inert atmosphere can lead to oxide regrowth. Expensive special hardware is thus required to ensure that the cleaned wafers are transported and stored in inert, purged environments from the time of cleaning to the next process.

Accordingly, there is a need for a method of cleaning a silicon surface in which the cleaned surface has enhanced stability against oxidation in a clean room environment, without the need for special transport and storage hardware.

SUMMARY OF THE INVENTION

In accordance with one aspect of the invention, a method is provided for forming a stable oxide-free silicon surface. The method includes cleaning a silicon surface. After cleaning, the silicon surface grows a native oxide of less than 1 Å after exposure to air for more than about 3 days.

In the illustrated embodiments, a standard APM clean is followed by a dilute HF dip to etch oxide grown by APM clean. The dilute HF solution is then rinsed away in situ, and the substrate (e.g., silicon wafer) is spin-dried under heated, ionized, high purity purge gas (i.e., $N_2$, Ar). Advantageously, the dilute HF etch and rinse steps employ ultrapure water with a resistivity at 25° C. of greater than 16 MΩ-cm and less than 10 ppb total organic carbon, less than 10 ppb dissolved silica, and less than 500 ppb dissolved oxygen. The process has been shown to demonstrate stability against significant native oxide regrowth for 8 days.

In accordance with another aspect of the invention, a method is provided for forming a stable oxide-free silicon surface of a substrate. The method includes cleaning said silicon surface and chemically growing an oxide. This oxide is then etched with hydrofluoric acid. The substrate is then rinsed and dried. The etching, rinsing and drying processes add fewer than 0.032 particles/$cm^2$ having a size larger than 0.12 μm to the silicon surface. For example, fewer than 10 particles (>0.12 μm) are added to a 200 mm wafer. In the illustrated embodiments, these processes add no net particles greater than 0.12 μm.

In accordance with another aspect of the invention, a bare silicon wafer is provided with a predominately hydrogen termination that is stable enough to limit oxidation to less than about 1 Å upon exposure to a clean room environment for greater than 3 days.

DETAILED DESCRIPTION OF THE PREFERRED EMBODIMENT

The embodiments of the method of the present invention provide a method for producing silicon wafers having pristine, hydrogen-terminated stable surfaces. Oxide re-growth on the silicon surface produced with embodiments of the method of the invention has been shown to be inhibited in a clean room environment for 8 days. The preferred embodiments therefore provide a silicon surface that is far more stable against oxidation than silicon surfaces produced by conventional treatments. Although the embodiments of the method of the invention are described in the context of cleaning a bare silicon wafer, it is to be understood that the preferred embodiments have broad applicability to cleaning a wide range of surfaces.

Figure 1:
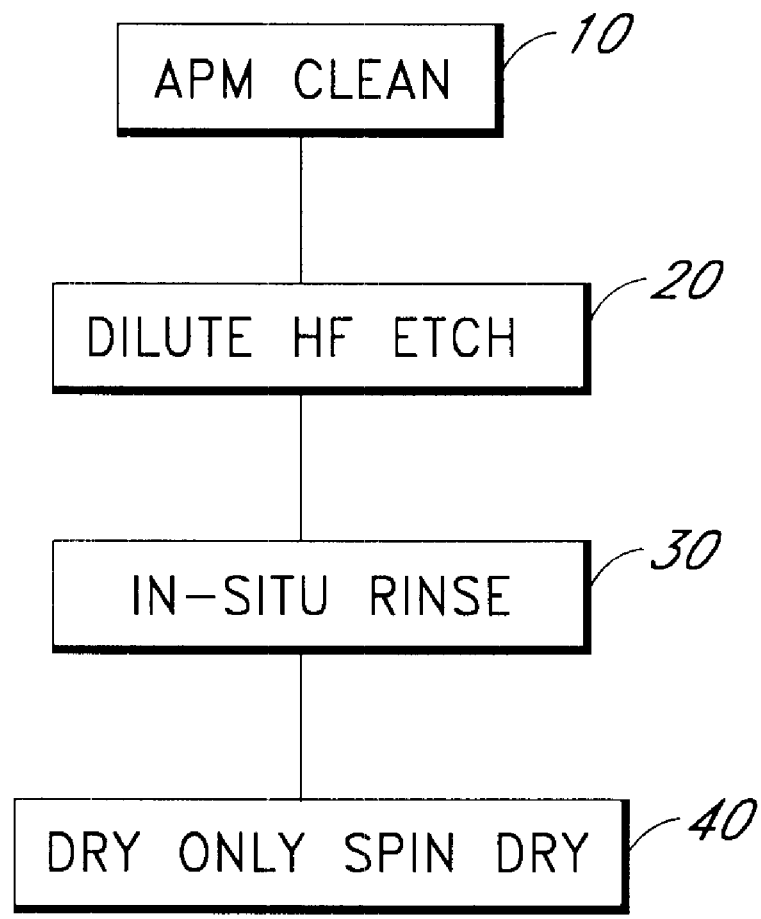
FIG. 1 is a block diagram generally illustrating a method for producing a stable oxide-free silicon surface, according to the preferred embodiments of the present invention.

FIG. 1 shows the steps in an embodiment of the present invention. The first step 10 is a treatment of the wafer with a mixture of ammonium hydroxide and hydrogen peroxide, known in the industry as an ammonium hydroxide/peroxide mixture (APM). The second step 20 is a dilute hydrofluoric acid etch. The third step 30 is an in-situ rinse. The fourth step 40 is a dry-only spin dry. Each of these steps will be described in more detail below.

Figure 2:
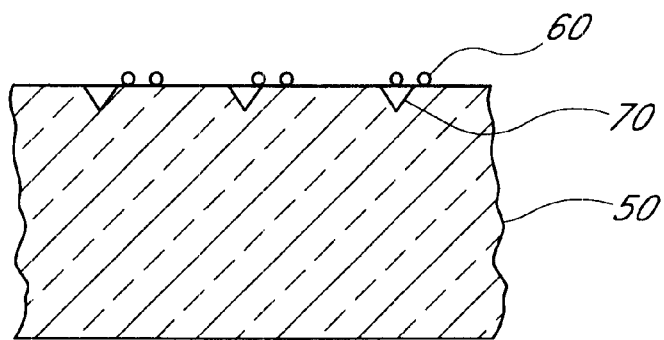
FIG. 2 is a schematic drawing of a silicon wafer before treatment with the preferred embodiment.
Figure 3:
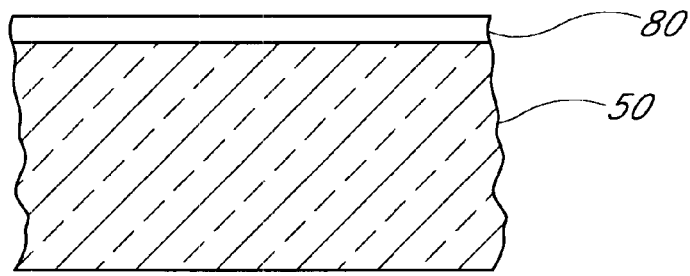
FIG. 3 is a schematic drawing of the silicon wafer of FIG. 2 after an ammonium hydroxide/peroxide mixture (APM) cleaning, showing the removal of particulates and surface defects and the generation of an oxide layer.
Figure 4:
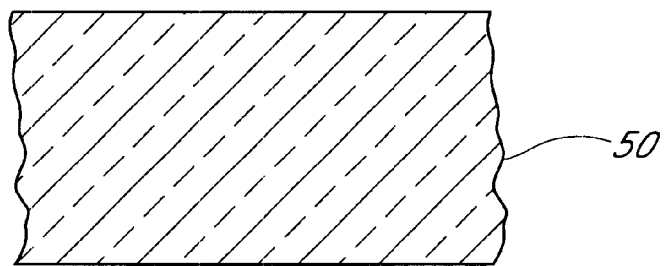
FIG. 4 is a schematic drawing of the silicon wafer of FIG. 3 after exposure to a dilute hydrofluoric acid (dHF) etch, according to the preferred embodiment, showing the removal of the oxide layer.

FIGS. 2–4 show the effects of the steps of FIG. 1 on a silicon wafer 50. FIG. 2 shows the silicon wafer 50 before performing the steps of FIG. 1. In FIG. 2, the silicon wafer 50 is covered with particles 60 and has surface defects 70. Treating the silicon wafer 50 of FIG. 2 with an APM mixture in step 10 of FIG. 1 removes the particles 60 and surface defects 70. The resulting silicon wafer 50 is shown in FIG. 3. A thin native oxide layer 80 grows on the surface of the silicon wafer 50 is chemically grown by the APM cleaning treatment 10, cleaning the surface in the process. The example of the silicon wafer 50 is illustrative only, and the method is believed to be applicable to cleaning at a wide variety of stages during integrated circuit fabrication.

The thin oxide layer 80 is removed by exposing the silicon wafer 50 to a dilute hydrofluoric acid etch in step 20 of FIG. 1. In the etched silicon wafer 50 of FIG. 4, the oxide layer 80 is no longer present. The etched silicon wafer 50 is then rinsed with water with an in-situ rinse, step 30 of FIG. 1. The rinsed silicon wafer 50 is dried in dry-only spin dry step 40 of FIG. 1.

While the steps in the broadly illustrated sequence of FIG. 1 are known, in general, the overall process sequence, including several enhancements described in more detail below, produce a silicon wafer 50 which has a far more stable termination than the silicon wafers produced by previous methods. The manner in which each of the steps of FIG. 1 was optimized is described in the Examples below. Advantageously, the process is optimized to maintain particle neutrality, i.e., to ensure that the process does not add more particles than are removed.

Ammonium Hydroxide/Hydrogen Peroxide Cleaning

Step 10 of FIG. 1 involves cleaning the silicon wafer 50 with an ammonium hydroxide/hydrogen peroxide mixture (APM). The ammonium hydroxide/hydrogen peroxide cleaning step 10 of the preferred embodiment uses a solution of 800 mL to 1,000 mL of 30% hydrogen peroxide, 300 mL to 600 mL of 29% ammonium hydroxide and 11 gallons (41 L) of water. Thus, the total bath concentration is preferably 0.50% to 0.80% by volume ammonium hydroxide, more preferably 0.58% to 0.73% ammonium hydroxide. The total bath concentration is preferably between about 0.10% to 0.50% hydrogen peroxide, more preferably about 0.21% to 0.42% hydrogen peroxide. The solution is preferably maintained at a temperature of about 20° C. to 50° C. more preferably 30° C.–40° C. and the wafer is maintained in the solution for about 5 minutes to 15 minutes. The APM solution of step 10 of FIG. 1 is similar to the SC-1 solution of the RCA cleaning process;

The APM cleaning step 10 removes particles 60, surface defects 70, and Group I and Group II metals from the silicon wafer 50 in the process of growing a chemical oxide. The APM cleaning may be done in an open vessel etch bath or other suitable vessel. Open vessel etch baths are commercially available. The M&A Recirculating Etch Bath, commercially available from Marks & Associates of Phoenix, AZ, is an exemplary open vessel etch bath which is suitable for use in the APM cleaning step 10. Other open vessel etch baths are suitable for the APM cleaning step 10. Furthermore, the APM cleaning step 10 is not limited to open vessel etch baths. Although the APM cleaning step 10 is important in obtaining a silicon wafer 50 having high stability according to embodiments of the method of the present invention, the APM cleaning step 10 of the illustrated embodiments is similar to the RCA Standard Clean 1, or SC-1, which, by itself, cannot produce the results described herein.

Dilute Hydrofluoric Acid Etch

The dilute hydrofluoric (dHF) acid etch step 20 of FIG. 1 is performed after the APM cleaning step 10. As shown in FIG. 3, an oxide layer 80 is present on the surface of the silicon wafer 50 after the APM cleaning step 10, as shown in FIG. 3. The dilute hydrofluoric acid etch step 20 removes the oxide layer 80 from the silicon wafer 50.

The dilute hydrofluoric acid for the dilute hydrofluoric etch step 10 preferably has a concentration of approximately 0.5% to 1.0% by weight (wt %) hydrogen fluoride, more preferably 0.5 wt. % HF. Use of a dilute hydrofluoric acid for the etch step 10 minimizes contamination on the surface of the silicon wafer 50. The dilute hydrofluoric acid is preferably heated to a temperature of about 35° C. to 60° C. more preferably at about 50° C. to minimize particles and to enhance hydrogen termination on the surface of the silicon wafer 50. The heated dilute hydrofluoric acid etch also provides for uniform oxide etch rates on the entire surface of the silicon wafer 50. The silicon wafer 50 is preferably exposed to the dilute hydrofluoric acid etch for a time period of between about 20 seconds and 2 minutes, more preferably for a time period of between about 40 seconds and 60 seconds, and most preferably for a time period of approximately 60 seconds.

As described in detail, for example, in Examples 6 and 8, the silicon wafer 50 can be etched with dilute hydrofluoric acid having a concentration of approximately 0.5 wt % hydrogen fluoride at a temperature of approximately 50° C. for approximately 60seconds.

The ultrapure water which is used to form the dilute hydrofluoric acid in the etch bath has high resistivity, indicating that the metals levels are low: By using water having high resistivity to form the dilute hydrofluoric acid in the etch bath, the quantity of metals which are deposited on the silicon wafer 50 during the dilute hydrofluoric acid etch 20 is minimized. The water which is used to form the dilute hydrofluoric acid in the etch bath has a resistivity greater than about 15 megaohms-cm (MΩ-cm) at a temperature of 25° C. and most preferably a resistivity of at least about 18 MΩ-cm. In the examples, 18.0 MΩ-cm was used. The total organic carbon (TOC) and the dissolved silica are also preferably minimized to levels of less than 10 ppb (parts per billion).

Several water treatments are preferably employed to achieve these stringent levels of water purification. In the preferred embodiments, municipal water is first soften by passing it though water softening resins (e.g., sodium zeolite cation resins) removing calcium and magnesium. A downstream reverse osmosis unit, such as the Filmtec™ BW30-4040, which removes about 98% of total dissolved solvents. The water is then subjected to a primary demineralizer, preferably comprising a mixed bed of ion exchange resins. Exemplary polystyrene beads are available from Rohm & Haas in 40% anion resin/50% cation resin mix. A downstream resin trap (1 μm filter) leads to a storage tank lined with polyethylene, polyvinylidenefluoride (PVDF) or other suitable materials to avoid contamination. A 2,000 gallon tank is employed in the preferred embodiment.

Downstream of the storage tank, water is constantly looped through a plurality of further treatments to ensure purity prior to use. The further treatments include exposure to a first ultraviolet (UV) source, preferably comprising a 254 nm ultraviolet (UV), available commercially as part number 1H-8L TOC Reduction unit from WEDECO Ideal Horizons, Inc. of Poultney, Vt. Filters remove particles down to about 0.2 μm, and a mixed bed of ion exchange resins (50/50 mix of anion and cation exchangers), with an attendant resin trap filter separate the first UV source from a second UV source. In the preferred embodiments, the second UV source comprises a 185 nm narrow band UV lamp, commercially available from Ideal Horizons as part number 1H-4L TOC Reduction unit. Treatment with ultraviolet light kills bacteria and fungi in the water. The particles formed by killing the bacteria and fungi are removed in other treatment steps. Another 0.2 μm filter desirably removes particles downstream of the second UV source.

The water purification system preferably also includes a plurality of monitors. In the preferred embodiment, the monitors includes a resistivity monitor (e.g., 200CR Resistivity Monitor, available from Thornton, Inc. of Waltham, MA) a pH monitor (e.g., part number 63221-1, also available from Thornton, Inc.) a total organic carbon (TOC) analyzer (e.g., model A-1000 TOC Analysis System, available from Anatel Corp. of Boulder, CO) and a particle counter, also available from Anatel Corp.

Another preferred treatment involves removing dissolved oxygen from the ultrapure water to a level of 500 ppb or less. The dissolved oxygen is removed with a degassification module, such as the Liqui-cel type G333, commercially available from Celgard of Charlotte, N.C. The water is preferably also filtered through zeta charged (+and/or -) point of use filters to neutralize any particles in the.water so that particle retention on the filters is maximized. The etch bath vessel, piping, and as much of the purification system as possible are made of PVDF (polyvinylidenefluoride) to minimize contamination from the vessel and piping.

The hydrofluoric acid which is used to form the dilute hydrofluoric acid in the etch bath is preferably gigabit grade (on the order of parts per trillion impurities) hydrofluoric acid with low levels of particles and dissolved metals, commercially available as Part No. 107101 in a 49% solution from Alameda Chemical of Tempe, Ariz., (480) 785-4685.

In the preferred embodiments, a high purity nitrogen purge curtain is employed at the air liquid interface during both the dilute hydrofluoric acid etch step 20 and the in-situ rinse step 30. The high purity nitrogen is filtered through a filter, which removes particles larger than 0.003 μm at the point of use. Ionizing the nitrogen before the nitrogen contacts the silicon wafer 50 minimizes particles. An ionizer, for example, is part of the Verteq SRD™ system. The high purity nitrogen enhances particle neutrality and stable surface termination on the silicon wafer 50.

In-Situ Rinse

After the silicon wafer 50 is etched with dilute hydrofluoric acid in step 20, the silicon wafer 50 is rinsed in-situ in the etch bath with ultrapure water for maximum hydrogen passivation of the etched silicon surface in the in-situ rinse step 30 of FIG. 1. The ultrapure water which is used for the in-situ rinse 30 desirably has the same purity as the ultrapure water which is used to form the dilute hydrofluoric acid in the etch bath to maintain stable hydrogen termination and particle neutrality. The etched silicon wafer is preferably rinsed with ultrapure water for a time period sufficient to remove all HF acid and particles from the previous etch step, which of course depends upon the volume of the etch bath.

Rinsing the silicon wafer 50 in-situ in the etch bath minimizes the amount of contamination. Further, an in-situ rinse eliminates the transfer step into a rinse bath. Contamination of the silicon wafer 50 could occur during the transfer to the rinse bath. In the illustrated embodiment, the in-situ rinse is conducted at approximately room temperature (typically 20° C.–25° C. or about 23° C.). The in situ rinse is preferably a cascade and displacement rinse.

As shown in Examples 6, 7, and 8, an exemplary rinse step 30 involves an in-situ rinse in the etch bath with ultrapure water at room temperature for approximately 15 minutes.

Spin-Drying

After the silicon wafer 50 is rinsed with ultrapure water, the silicon wafer 50 is dried in the spin-dry step 40 of FIG.

1. Although a variety of spin-drying apparatuses are suitable for the drying step 40, the Verteq 1800 is an exemplary spin/rinse dryer, commercially available from Verteq, Inc. of Santa Ana, Calif. The silicon wafer 50 is transferred to the spin/rinse dryer after rinsing in the in-situ rinse step 30. In the spin-only dry step 40, the silicon wafers 50 are spun dry while hot, ionized nitrogen is flowed into the dryer at a rate of between about 15 slm and 25 slm. The hot nitrogen gas preferably at a temperature of 60° C. to 80° C. more preferably at a temperature of 60° C. to 80° C. and most preferably at a temperature of about 70° C. Only the dry cycle is carried out at 400 rpm to 600 rpm, without using the rinse cycle of the machine. The nitrogen stream is passed through a filter, which removes particles larger than 0.003 $\mu$m before entering the dryer. The dry only spin-dry step 40 is carried out until the silicon wafers 50 are dry, typically approximately 240 seconds for bare silicon wafers and approximately 480 seconds for patterned wafers. The dry only spin-dry step 40 enhances particle neutrality and stable surface termination on the silicon wafer 50.

As described in detail in Examples 3, 4, and 5, in an exemplary embodiment, the silicon wafer 50 is dried in a dry only spin-dry step 40 at 500 rpm for 240 seconds for a bare silicon wafer or 480 seconds for a patterned silicon wafer with the heater on and antistat (ionization) on.

Although each of the features described above can be used independently of the other features, it is most preferred to use all of the preferred features described above. The preferred embodiments are simple and economical means of achieving a silicon wafer 50 having high surface stability. All of the items that are used in the method are commercially available, and the process conditions are easily adaptable to any typical wet bench.

As shown in Example 1, the silicon wafers that are treated by the embodiments of the present invention have surfaces that are stable against oxidation for greater than 3 days, more preferably greater than 5 days, and most preferably greater than 7 days. A hydrogen-terminated silicon surface is considered "stable" against oxidation, as used herein, if the surface has an average thickness of less than 1 Å oxide on the surface when the silicon surface is stored in air in a clean room environment. The optimized conditions disclosed herein leave showed as low as 0.1 Å oxide re-growth after eight days. By comparison, conventional cleaning and rinsing.methods leave surfaces stable for only about 20 minutes. To the inventors knowledge, even the best hydrogen-terminated silicon surface produced by-conventional methods is stable for no longer than 48 hours in air. The hydrogen-terminated silicon surface produced by the preferred methods thus has significantly greater stability against oxidation than even the best previously produced hydrogen-terminated silicon surface.

By comparison, conventional cleaning and rinsing methods leave surfaces stable for only about 20 minutes.

Without being limited by a theory, it is believed that the stability of the hydrogen-terminated silicon surface produced with the preferred embodiments is aided by minimizing the number of particles added to the surface of the silicon surface during the four steps of the method shown in FIG. 1. The overall process preferably adds fewer than 10 particles having a size greater than 0.12 $\mu$m to the surface of the silicon wafers. More preferably, the four steps add no net particles greater than 0.12 $\mu$m to the wafer surfaces, most preferably reducing overall particle numbers. Particle numbers were measured using a Tencor Surfscan® 6200 particle counter, available commercially from KLA-Tencor of San Jose, Calif.

Some advantages of the preferred embodiments include the following:

1. The processing is done at low temperatures;
2. The cost of the equipment and chemicals is low;
3. The method is readily accepted by customers;
4. The method can be employed using a wide range of commercially available equipment;
5. The etch chemistry is simple; and
6. The method is safe and produces a minimum of environmentally hazardous waste products.

EXAMPLE 1

Preparation of a Stable Hydrogen-Terminated Silicon Surface

In Example 1, a silicon wafer with hydrogen-terminated surfaces was produced according to the preferred embodiments. The stability of the hydrogen-terminated silicon wafer surface produced by Example 1 was measured in Example 2 as a function of time. The surface was stable for at least about 3 days, and in fact was shown to be stable for greater than about 7 days, about 4 times longer than the surfaces of wafers produced by the best previously available conventional technologies.

A 200-mm silicon wafer was dipped into a solution of ammonium hydroxide and hydrogen peroxide, as described above, at 35° C. for 10 minutes in a Verteq Megasonic™ (recirculating) Cleaning Bath. The wafers were then placed in a dump rinse tank using ultrapure water for 10 minutes. From here the wafers were put into the Marks & Associates Recirculating Etch Bath. A solution of 0.5 wt % hydrofluoric acid at a temperature of 50° C. was then contacted with the silicon wafer in the etch bath for approximately 60 seconds. The hydrofluoric acid was displaced from the etch bath, and the silicon wafer was rinsed in-situ in the etch bath with ultrapure water for approximately 15 minutes. The wafers are not exposed to air between the etch and in situ rinse steps.

The rinsed silicon wafer was transferred to a Verteq 1800 spin rinser/dryer, and the silicon wafer was dried (without using the rinse cycle) by spinning the wafer at 500 rpm for 240 seconds while introducing 10–30 slm of ionized nitrogen at a temperature of approximately 60° C.–80° C. into the spin rinser/dryer. After cooling, the silicon wafer was removed from the dryer.

EXAMPLE 2

Determination of the Stability of the Hydrogen-Terminated Silicon Surface

In Example 2, the stability of the hydrogen-terminated surface of the silicon wafer produced in Example 1 was determined.

Hydrogen-terminated 200-mm silicon wafers produced with the method described in Example 1 were transferred to an electron spectroscope for chemical analysis, determining the surface composition at two locations as a function of time. After the initial measurement, the silicon wafers were removed from the instrument and were stored in a standard clean room environment. The surface composition was measured again at the two locations after 4 and after 8 days, respectively. The silicon wafers were stored in a standard clean room environment between the measurements. The results of the surface analysis of the silicon wafers of Example 1 are shown in Table 1 below together with a comparison with control wafers cleaned, rinsed and dried by conventional methods.

TABLE 1

Surface Composition (Mole %) of the Silicon Wafers of Example 1 as a Function of Time

| Sample | Day | O | N | C | Si | F | Oxide Thickness (Å) |
|---|---|---|---|---|---|---|---|
| Control @ center | 1 | 30.5 | 0.3 | 15.9 | 53.2 | 0.1 | 5.0 |
| Control @ half radius | 1 | 29.6 | 0.3 | 15.0 | 55.0 | 0.0 | 4.6 |
| center | 1 | 6.5 | 0.3 | 33.9 | 58.8 | 0.5 | 0.2 |
| half-radius | 1 | 6.6 | 0.2 | 35.5 | 57.1 | 0.6 | 0.2 |
| center | 4 | 7.2 | 0.4 | 34.9 | 57.4 | 0.2 | 0.1 |
| half-radius | 4 | 7.1 | 0.3 | 33.2 | 59.3 | 0.1 | 0.2 |
| center | 8 | 9.5 | 0.1 | 21.8 | 68.3 | 0.3 | 0.7 |
| half-radius | 8 | 9.7 | 0.1 | 22.0 | 67.9 | 0.3 | 0.7 |

As seen in Table 1, the surface of the wafers cleaned according to embodiments of the method of the invention was stable in air for greater than 3 days, and, in fact, the tested wafers remained stable (with less than 1 Å oxide regrowth) for 8 days. Even after 8 days, the surface of the wafers cleaned according to embodiments of the present invention had only 9.5% and 9.7% by mole ratio oxygen on the surface, compared to about 30 mole % oxygen within 1 day for the control wafer. The average thickness of the native oxide on the surface of the wafers after 8 days was only 0.7 Å, compared to 5.0Å and 4.6Å for the control wafers. Finally, the average thickness of silicon oxide on the surface of the wafers cleaned by the preferred embodiments only increased from 0.2Å to 0.7Å during the course of 8 days. The silicon wafers produced according to the preferred embodiments were thus far more resistant to oxidation than the wafers cleaned by conventional processes.

The method used to produce the hydrogen-terminated silicon wafer of Example 1 was developed through extended research, including a series of experiments in which the conditions for step 20, the dilute hydrofluoric acid etch, step 30, the in-situ rinse, and step 40, the dry-only spin dry, were varied. The experiments are described in Examples 3–8 below.

The optimized conditions for each of the steps were selected to provide an exemplary method according to embodiments of the invention. Although the conditions of each of the steps can be varied somewhat from the optimized conditions described in the examples below, most preferably the optimized condition for each of the steps is employed for greatest stability of the cleaned wafers.

In all of the Examples, an M&A Custom Wet Bench, commercially available from Marks & Associates of Phoenix, Ariz. was used for the hydrofluoric acid etch and in-situ rinse, a Verteq 1800 spin rinser/dryer, commercially available from Verteq, Inc. of Santa Ana, Calif. was used for the drying, and a Tencor Surfscan® 6200 Particle Monitoring System, commercially available from KLA-Tencor Corp. of San Jose, Calif., for the particle analysis. The Tencor Surfscan® 6200 counts the particles through optical scattering of a laser beam. The number of particles added during each process was obtained by measuring the number of particles on the wafer before the process and the number of particles on the wafer after the process. The difference in the number of particles on the wafer before and after the process was the number of particles added or removed during the process.

EXAMPLE 3

Effects of Spin Rate During Drying on the Number of Added Particles

In Example 3, the spin rate during the dry step was varied to study the effect of the spin rate on the number of particles added during the drying process.

Figure 5:
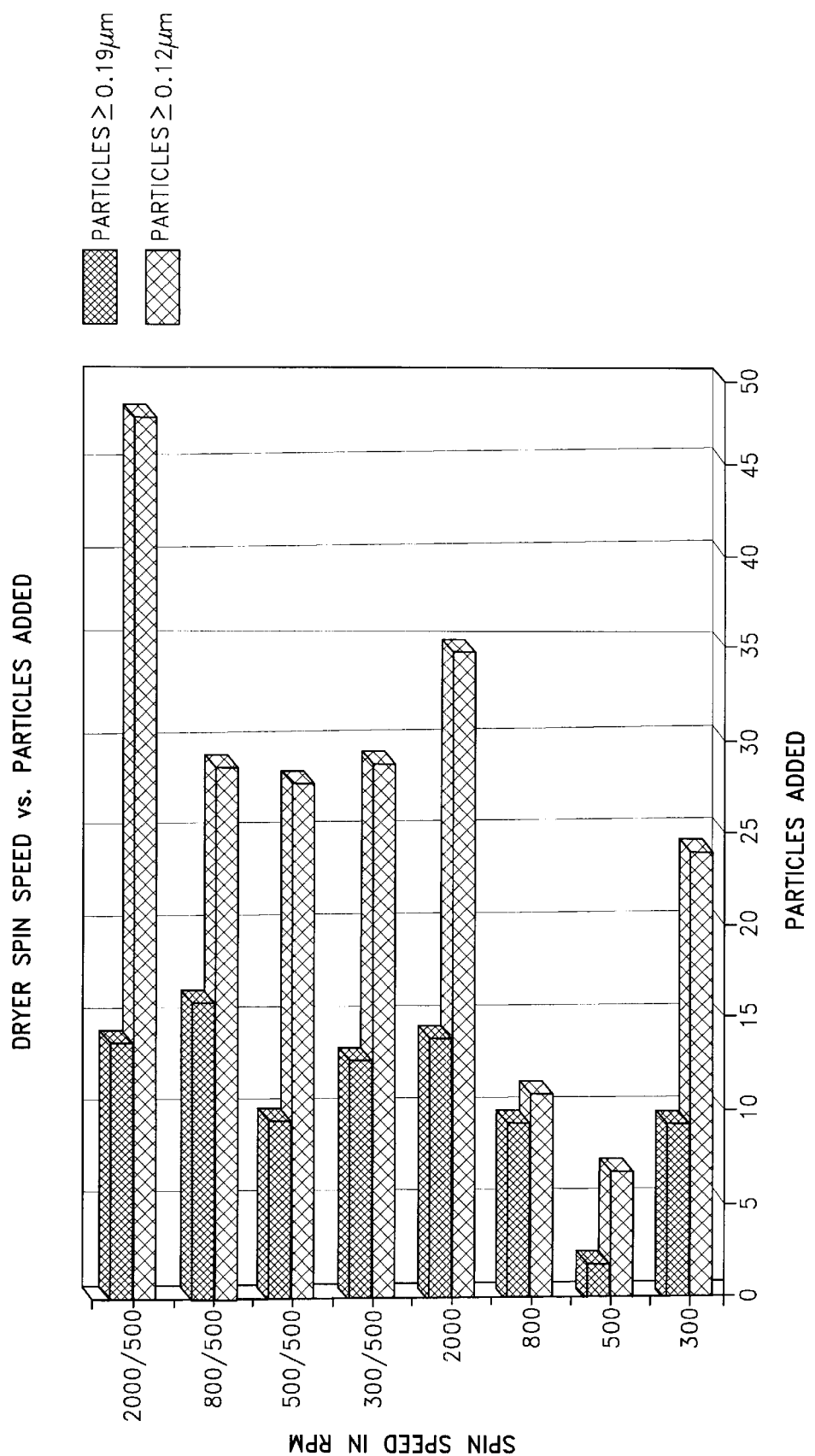
FIG. 5 is a series of bar graphs showing the number of particles added during a drying cycle with various spin speeds in a dry only cycle.

Silicon wafers (200-mm) were dipped into 1.0 wt % hydrofluoric acid at a temperature of 50° C. for 60 seconds and were rinsed in a quick dump rinser with room temperature ultrapure water for 10 minutes. After rinsing, the silicon wafers were dried in a spin rinse dryer at various rotation speeds for 240 seconds in a dry-only cycle with 10–30 slm ultrapure nitrogen at a temperature of approximately 60° C.–80° C. After rinsing and drying, the number of added particles having sizes larger than 0.12 $\mu$m and larger than 0.19 $\mu$m, respectively, were measured. The results shown in Table 2 and FIG. 5 are the mean of three separate tests. In the cases where two spin rates are shown in Table 2, the wafer was dried for 240 seconds at each spin rate.

TABLE 2

Number of Particles Added During Drying Cycle

| | Number of Particles Added | |
|---|---|---|
| Dry Speed (RPM) | >0.12 $\mu$m | >0.19 $\mu$m |
| 300 | 24 | 9 |
| 500 | 6.7 | 1.7 |
| 800 | 11 | 9.3 |
| 2000 | 35 | 14 |
| 300/500 | 29 | 13 |
| 500/500 | 28 | 9.7 |
| 800/500 | 29 | 16 |
| 2000/500 | 48 | 14 |

As seen in Table 2 and FIG. 5, drying with a spin rate of 500 rpm added the least number of particles, both in the larger than 0.12 $\mu$m range and in the larger than 0.19 $\mu$m range. A dry speed between 300 rpm and 800 rpm, and more preferably about 500 rpm in the spin rinser/dryer was therefore selected as being optimal in adding the smallest number of particles. Drying with two spin rates appeared to add more particles than drying with a single spin rate. This may be the result, however, of drying for a longer time period (480 seconds) with the two spin rates, rather than for 240 seconds with the single spin rate.

EXAMPLE 4

Effects of Drying Time on the Number of Added Particles

In Example 4, the drying time in the spin rinser/dryer was varied to study the effect of the drying time on the number of particles added during the drying process.

Figure 6:
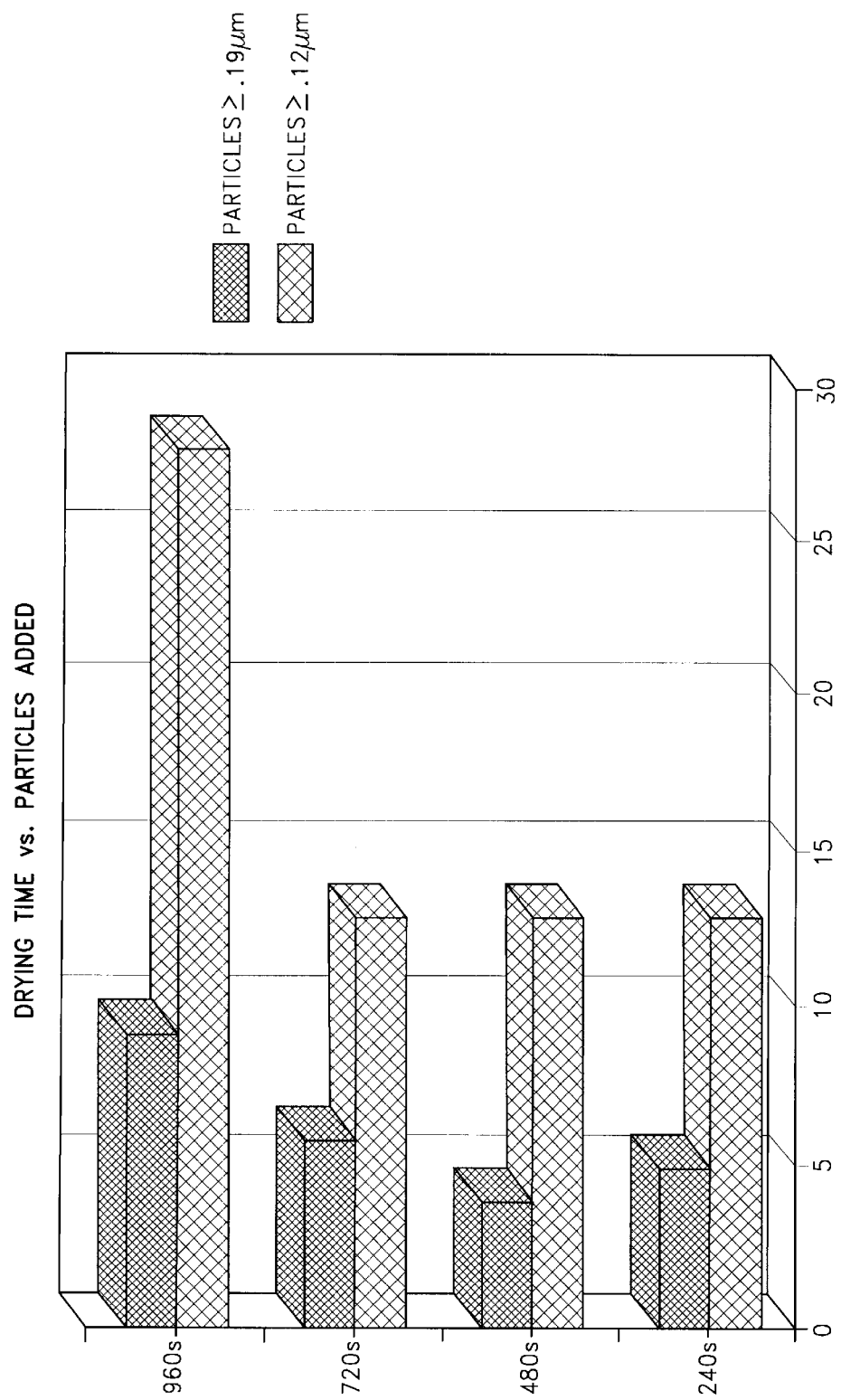
FIG. 6 is a series of bar graphs showing the number of particles added with various drying times in the dry only cycle.

Silicon wafers were dipped into 0.5 wt % hydrofluoric acid at a temperature of 50° C. for 60 seconds and were rinsed in the etch bath in an in-situ rinse with ultrapure water at room temperature for 15 minutes. After rinsing, the silicon wafers were transferred to a spin rinse dryer and were dried at 500 rpm for various times in a dry-only cycle with 10–30 slm ultrapure nitrogen at a temperature of approximately 60° C.–80° C. The number of particles having sizes larger than 0.12 $\mu$m and larger than 0.19 $\mu$m, respectively, which were added during the drying process were measured after the drying step was complete. The results shown in Table 3 and FIG. 6 are the mean of three separate tests.

TABLE 3

Number of Particles Added During Drying Cycle

| Dry Time (Seconds) | Number of Particles Added | |
|---|---|---|
| | >0.12 μm | >0.19 μm |
| 240 | 13 | 5.0 |
| 480 | 13 | 4.0 |
| 720 | 13 | 6.0 |
| 960 | 28 | 9.3 |

As seen in Table 3 and FIG. 6, drying times of 240–720 seconds added fewer particles to the wafer than the drying time of 960 seconds. A dry time of 240 seconds in the spin rinser/dryer was therefore selected as being optimal in adding a small number of particles and minimizing the time required for drying. Dry times of up to 720 seconds add approximately the same number of particles as the shorter drying time of 240 seconds. Drying times longer than 240 seconds but shorter than 720 seconds can be chosen in alternative embodiments. It was found that 240 seconds was sufficient for drying unpatterned wafers, whereas patterned wafers are preferably dried for 480 seconds.

EXAMPLE 5

Effects of Heater and Anti-Static Options on the Number of Added Particles

In Example 5, the effects of various heater and antistatic options during drying on the number of particles added to the wafer were studied.

Figure 7:
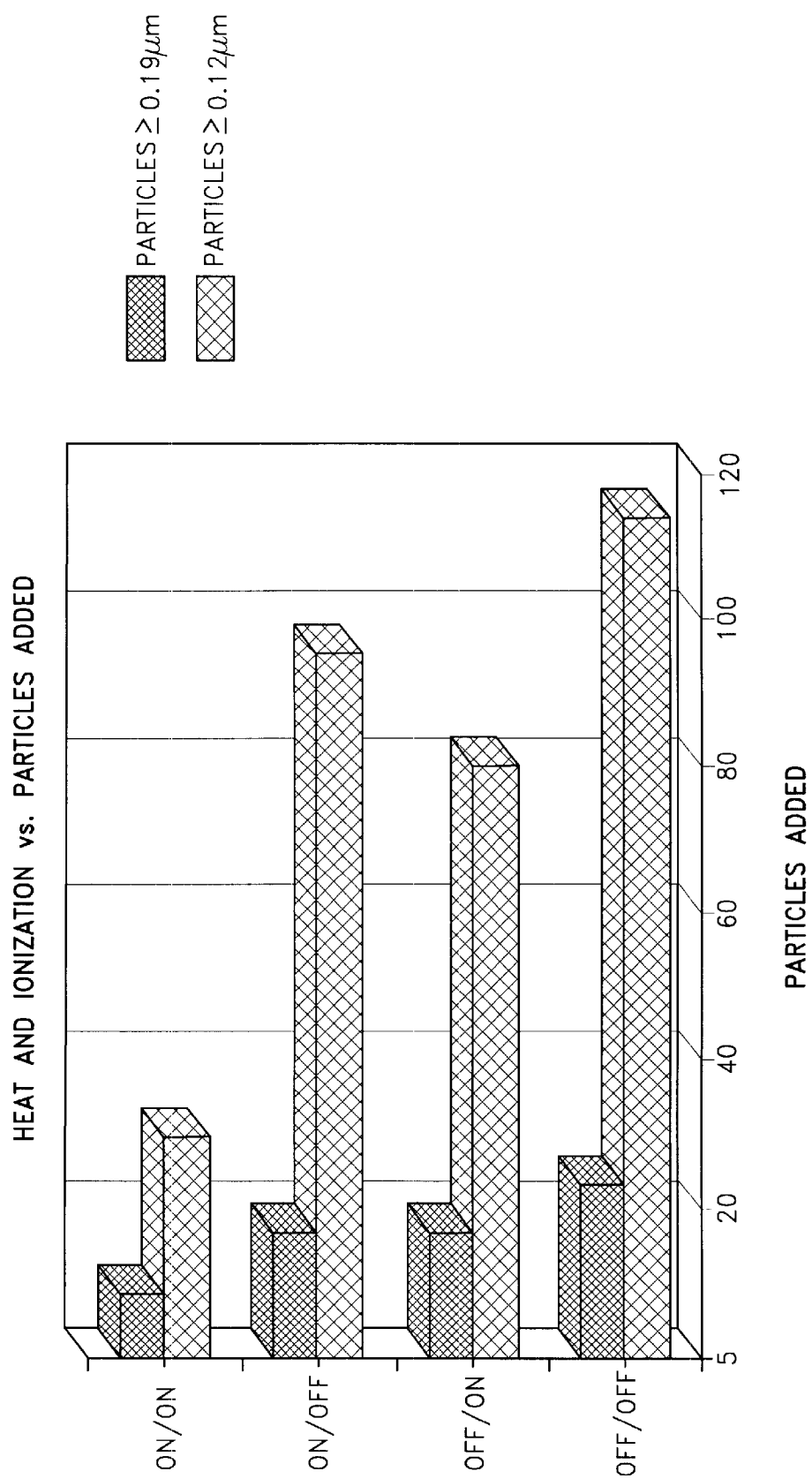
FIG. 7 is a series of bar graphs showing the number of particles added with various heater and antistatic options for the dry only cycle.

Silicon wafers were dipped into 1 wt % hydrofluoric acid at a temperature of 50° C. for 60 seconds and were rinsed in an quick dump rinser with ultrapure water at room temperature for 10 minutes. After rinsing, the silicon wafers were dried at 60° C.–80° C. in a spin/rinse dryer at 500 rpm for 240 seconds using only the dry cycle with 10–30slm ultrapure nitrogen. The number of particles having sizes larger than 0.12 μm and larger than 0.19 μm, respectively, which were added during the drying process were measured. The results shown in Table 4 and FIG. 7 are the mean of three separate tests.

TABLE 4

Number of Particles Added During Drying Cycle With Varying Heater/Antistatic Options

| Heater/Antistat | Number of Particles Added | |
|---|---|---|
| | >0.12 μm | >0.19 μm |
| Off/Off | 114 | 23 |
| Off/On | 80 | 17 |
| On/Off | 96 | 17 |
| On/On | 30 | 9 |

As seen in Table 4 and FIG. 7, drying in the spin/rinse dryer with the heater (about 60° C. to 80° C.) on and the ionizer on added fewer particles than the other options. Drying with both the heater and the antistat (ionizer) off added the largest number of particles of all the options. Drying with either the heater or the antistat off added intermediate numbers of particles. Drying with both the heater and the antistat on during the drying process is therefore preferred for the drying process, because fewer particles were added to that wafer than with the other options.

EXAMPLE 6

Effects of Etching and Rinsing Temperatures on the Number of Added Particles

In Example 6, the effects of the temperatures during the etching and rinsing steps on the number of added particles were studied.

Figure 8:
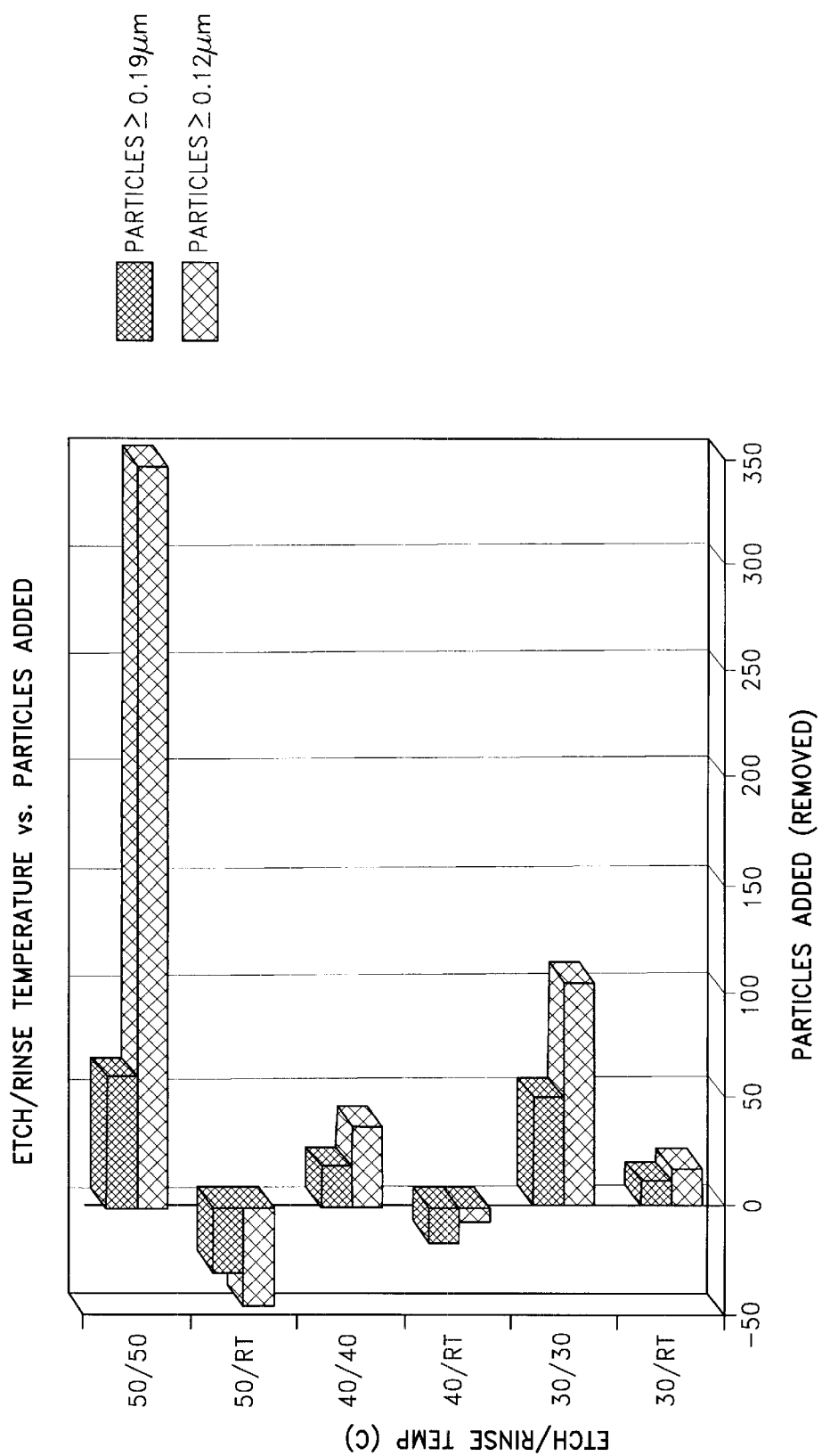
FIG. 8 is a series of bar graphs showing the number of particles added with various temperatures for the etch and rinse baths.

Silicon wafers were dipped into 0.5 wt % hydrofluoric acid at various temperatures for 60 seconds and were rinsed in-situ in the etch bath with ultrapure water at various temperatures for 15 minutes. The wafers were dried in a spin rinser/dryer using only the dry cycle at 500 rpm for 480 seconds with 10–30 slm ultrapure nitrogen at a temperature of 60° C.–80° C. The number of particles having sizes larger than 0.12 μm and larger than 0.19 μm which were added during the etching, rinsing, and drying process were measured. The results shown in Table 5 and FIG. 8 are the mean of three separate tests.

TABLE 5

Number of Particles Added During Etching, Rinsing, Drying Cycle With Varying Etch and Rinse Temperatures

| Etch/Rinse Temperature (° C.) | Number of Particles Added | |
|---|---|---|
| | >0.12 μm | >0.19 μm |
| 30/RT | 17 | 11 |
| 30/30 | 105 | 51 |
| 40/RT | −7 | −16 |
| 40/40 | 37 | 19 |
| 50/RT | −45 | −30 |
| 50/50 | 348 | 61 |

The first number in the first column of Table 5 is the temperature of the hydrofluoric acid during the etching step, and the second number is the temperature of the rinse water. RT indicates room temperature, where the deionized water heater was turned off. It will be understood that the actual temperature in the open etch vessel will be slightly higher than room temperature due to the preceding heated HF etch step. The number of added particles are shown in Table 5 and FIG. 8.

In all of the experiments with room temperature rinses, either very few particles were added, or the number of particles on the wafer was reduced, as indicated by the negative numbers in Table 5. Rinsing the wafer with ultrapure water at room temperature is therefore a preferred embodiment.

In the experiments with room temperature ultrapure water rinses, the number of particles on the silicon wafer decreased as the temperature of the hydrofluoric acid etch solution increased from 30° C. to 50° C. Etching at 40° C. or greater is preferred and most preferably at approximately 50° C. Using temperatures of approximately 50° C. for the hydrofluoric acid etch and room temperature for the ultrapure water rinse are most preferred.

Significantly, if-the hydrofluoric acid etch is performed at 50° C. and the rinse is also performed at 50° C. the number of particles added is greater than under other conditions. It is therefore important to optimize both the temperature of the hydrofluoric acid etch and the temperature of drying, rather than optimizing the temperature of only one of the two processes.

EXAMPLE 7

Effects of Rinse Conditions and Times on Quantity of Particles

In Example 7, various rinsing procedures were tested to study the effect of the rinsing procedure on the quantity of particles that were added to the silicon wafer during the rinsing process.

Figure 9:
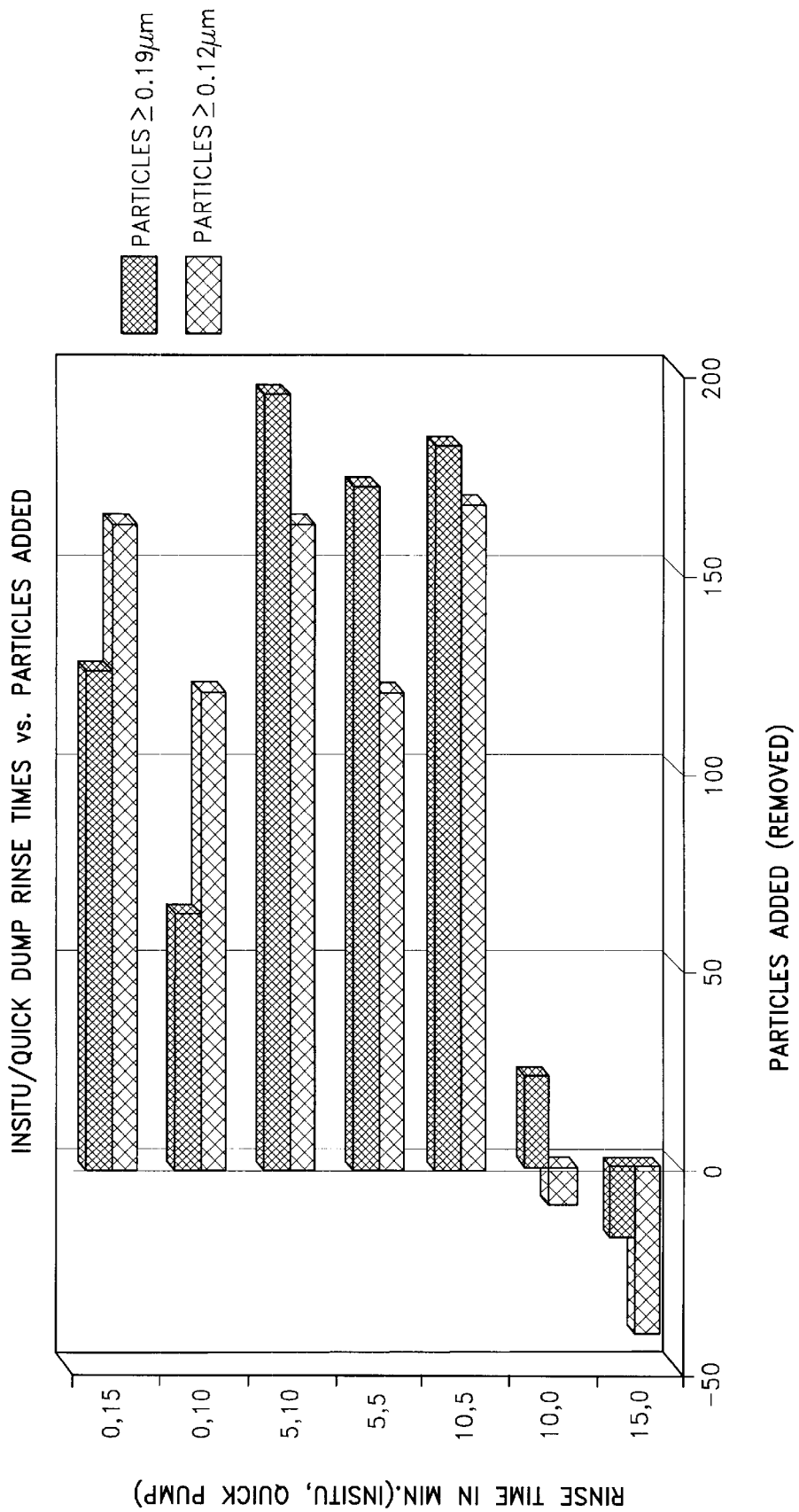
FIG. 9 is a series of bar graphs showing the number of particles added with various lengths of time for rinsing cycles with in-situ and quick dump rinses.

Silicon wafers were dipped into 0.5 wt % hydrofluoric acid at a temperature of 50° C. for 60 seconds. Both in-situ rinses in the etch bath and quick dump rinses (QDR) were performed with ultrapure water at room temperature. After rinsing, the silicon wafers were dried in a spin rinse/dryer at 500 rpm for 240 seconds using only the dry cycle with 10–30 slm ultrapure nitrogen at a temperature of approximately 60° C.–80° C. After rinsing with various conditions and drying with identical conditions, the number of added particles having sizes larger than 0.12 μm and larger than 0.19 μm were measured. The results shown in Table 6 and FIG. 9 are the mean of three separate tests.

TABLE 6

Number of Particles Added During Rinse Cycle

| Rinse Time (Minutes) | Number of Particles Added | |
|---|---|---|
| [In-Situ, Quick Dump] | >0.12 μm | >0.19 μm |
| 15, 0 | −42 | −18 |
| 10, 0 | −9.7 | 23 |
| 10, 5 | 167 | 181 |
| 5, 5 | 119 | 171 |
| 5, 10 | 162 | 195 |
| 0, 10 | 119 | 64 |
| 0, 15 | 162 | 125 |

The first number under the rinse time is the number of minutes that in-situ rinsing was performed. The second number is the number of minutes that a quick dump rinse was performed. In the first two runs, the entire rinsing procedure was an in-situ rinse, and, in the last two runs, the entire rinsing procedure was a quick dump rinse.

As seen in Table 6 and FIG. 9, the quick dump rinse procedure added significant numbers of particles to the silicon wafer in both the range larger than 0.12 μm range and in the range larger than 0.19 μm, regardless of the length of time that the quick dry rinse procedure was carried out.

In contrast, in the rinse procedure with a 15 minute in-situ cascade rinse and no quick dump rinse, the number of particles on the wafer actually decreased in both the greater than 0.12 μm range and the greater than 0.19 μm range with a 15 minute in-situ rinse, as shown by the negative numbers in Table 6. With a 10 minute in-situ rinse and no quick dump rinse, the number of particles larger than 0.12 μm decreased slightly, while the number of particles larger than 0.19 μm increased slightly.

Based on the results in Table 6 and FIG. 9, rinsing with an in-situ rinse adds fewer particles to the silicon wafer 50 (and in fact reduced particles) than rinsing with a quick dump rinse. Further, a 15 minute in-situ rinse reduced particles more than a 10 minute in-situ rinse. Accordingly, in-situ rinsing for greater than 10 minutes, and more preferably about 15 minutes, is preferred.

EXAMPLE 8

Effects of Varying the Hydrofluoric Acid Concentration and the Rinse Conditions and Times on Quantity of Added Particles In Example 8, the effects of varying the concentration of the hydrofluoric acid and the rinsing conditions on the number of added particles were studied.

Figure 10:
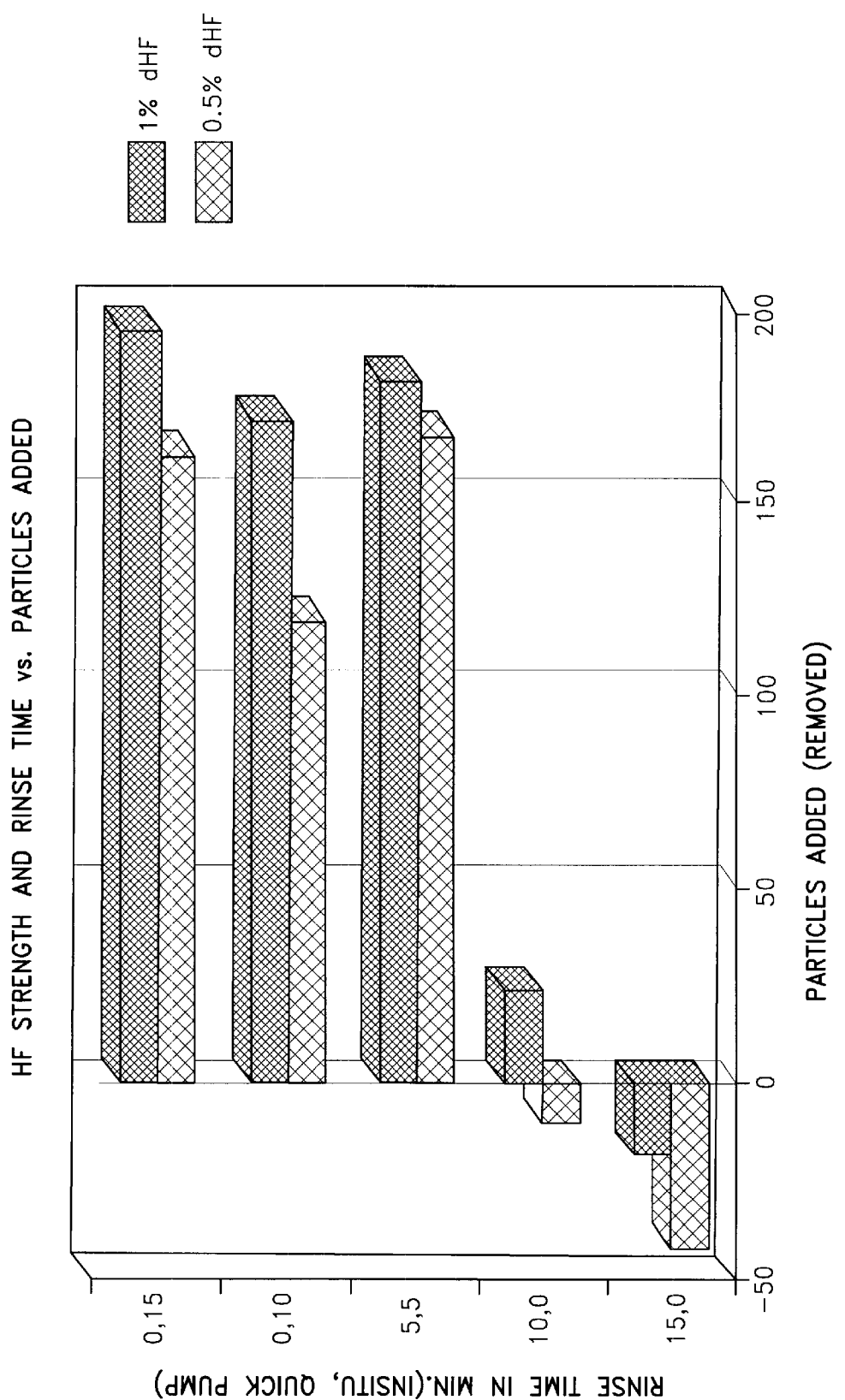
FIG. 10 is a series of bar graphs showing the number of particles added with various concentrations of hydrofluoric acid and various rinse times for in-situ rinses and quick dump rinses.

Silicon wafers were dipped into 0.5 wt % or 1.0 wt % dilute hydrofluoric acid (DHF) at a temperature of 50° C. for 60 seconds. Both the in-situ rinses in the etch bath and the quick dump rinses (QDR) were performed with ultrapure water at room temperature. After rinsing, the silicon wafers were dried in the spin rinse/dryer at 500 rpm for 240 seconds in a dry-only cycle with 10–30 slm ultrapure nitrogen at a temperature of 60° C.–80° C. After etching, rinsing, and drying, the number of added particles having sizes larger than 0.12 μm were measured. The results shown in Table 7 and FIG. 10 are the mean of three separate tests.

TABLE 7

Number of Particles Added During Etching Rinsing and Drying Cycle

| Rinse Time (Minutes) | Number of Particles Added | |
|---|---|---|
| [In-Situ, Quick Dump] | 0.5% dHF | 1.0% dHF |
| 15, 0 | −42 | −18 |
| 10, 0 | −9.7 | 23 |
| 5, 5 | 167 | 181 |
| 0, 10 | 119 | 171 |
| 0, 15 | 162 | 195 |

As in Table 6, the first number in the first column of Table 7 is the number of minutes of in-situ rinsing, and the second number in the first column is the number of minutes of quick dump rinsing. As shown earlier in Example 7 and as confirmed in the results of Table 7 and FIG. 10, the number of added particles when a quick dump rinse is used was always higher than when an in-situ cascade rinse is used. In-situ rinsing is therefore more preferred.

As best seen in Table 7, fewer particles were added to the silicon wafer with the 0.5 wt % hydrofluoric acid etch than with the 1.0 wt % hydrofluoric acid etch in all of the examples. Etching with 0.5 wt % hydrofluoric acid is therefore more preferred.

The number of particles on the silicon wafer added with the 15 minute in-situ rinse was lower than with a 10 minute in-situ rinse in the examples with both concentrations of hydrofluoric acid. Accordingly, as noted with respect to Example 7, in-situ rinsing is preferably conducted for greater than 10 minutes, and more preferably about 15 minutes.

The method of preparing a stable, oxide-free silicon surface according to embodiments of the present invention therefore has many aspects. Some of these aspects, aimed at minimizing particle generation, are summarizing below:

1. cleaning the wafer with an ammonium hydroxide/hydrogen peroxide/water mixture (an APM clean);
2. etching the cleaned wafer with dilute hydrofluoric acid having a concentration of approximately 0.5 wt % to 1.0 wt % HF, more preferably about 0.5 wt % HF, at greater than 40° C. more preferably at approximately 50° C.;
3. rinsing the etched wafer in-situ in the etch bath with ultrapure water at room temperature for between about 10 minutes and 15 minutes, more preferably about 15 minutes; and
4. drying the rinsed wafer in a spin-only dry step at approximately 400–600 rpm with ionized purge gas and the heater on (approximately 60° C.–80° C.) for approximately 240 seconds to 720 seconds, more preferably about 240 seconds for bare, unpatterned silicon wafers or approximately 480 seconds for patterned wafers.

The ultrapure water which is used to make the dilute hydrofluoric acid and which is used in the rinse preferably has a resistivity of greater than 16 megaohms-cm at 25° C. and contains less than 10 ppb total organic carbon, less than 10 ppb dissolved silica and less than 500 ppb of dissolved oxygen. The ultrapure water is exposed to ultraviolet light and is filtered through mixed ion exchange resins. The ultrapure water is filtered through zeta-charged point-of-use filters before entering the etch bath. The etch bath, piping, and as much of the purification system as possible are made of polyvinylidenefluoride.

The hydrofluoric acid which is used to form the dilute hydrofluoric acid in the etch bath is gigabit grade hydrofluoric acid. A high purity nitrogen purge curtain is employed at the air liquid interface during both the dilute hydrofluoric acid etch step and the in-situ rinse step. The nitrogen is ionized and is filtered to remove particles larger than 0.003 $\mu$m. Other aspects of the method have been described in detail in both the description of the method and the examples. Although it is generally preferred to include all of the above enhancements in order to obtain a wafer having high stability and pristine quality, employing only some of the enhancements can produce wafers of higher quality than produced by previous methods.

By using the preferred embodiments, silicon surfaces having hydrogen-terminated surfaces are produced which are stable against oxidation (i.e., less than 1 Å oxide regrowth in air) for greater than 3 days, more preferably greater than 5 days, and most preferably greater than 7 days. The preferred HF etch, rinse and drying processes are optimized to add fewer than 10 particles having a size greater than 0.12 $\mu$m to the silicon surface. More preferably, the etch, rinse and drying steps result in a net reduction in surface particles.

Various modifications and alterations of this invention will be apparent to those skilled in the art without departing from the scope and spirit of this invention. It is to be understood that the invention is not limited to the embodiments disclosed herein, and that the claims should be interpreted as broadly as the prior art allows.

We claim:

1. A method of forming a stable oxide-free silicon surface, comprising:
    cleaning the silicon surface with a solution comprising ammonium hydroxide, hydrogen peroxide, and water;
    etching the silicon surface with dilute hydrofluoric acid after cleaning;
    rinsing the silicon surface after etching; and
    spin-drying the silicon surface after rinsing,
    wherein the cleaned silicon surface grows a native oxide of less than 1 Å after exposure to air for more than about 3 days.
2. The method of claim 1, wherein said dilute hydrofluoric acid is approximately 0.5% to 1.0% hydrofluoric acid by weight.
3. The method of claim 2, wherein said dilute hydrofluoric acid is at a temperature of approximately 40° C.–60° C.
4. The method of claim 1, wherein said etching is performed with approximately 0.5% by weight hydrofluoric acid at greater than about 40° C. for greater than 40 seconds.
5. The method of claim 1, wherein spin-drying is conducted at a speed of approximately 400 rpm to 600 rpm.
6. The method of claim, 4, wherein spin-drying comprises exposing said silicon surface to inert gas at a temperature of approximately 60° C.–80° C.
7. The method of claim 6, wherein said inert gas is ionized.
8. The method of claim 1, wherein rinsing is performed in-situ following etch in an etch bath.
9. The method of claim 8, wherein said etch bath is under a high purity nitrogen purge.
10. The method of claim 8, wherein rinsing comprises supplying deionized water at approximately room temperature.
11. The method of claim 10, wherein rinsing is conducted for approximately 10–15 minutes.
12. The method of claim 11, wherein spin-drying is conducted for about 240 seconds to 480 seconds.
13. The method of claim 11, wherein rinsing is conducted for approximately 15 minutes.
14. The method of claim 1, wherein rinsing comprises employing ultrapure water with a resistivity greater than about 16 M$\Omega$-cm at 25° C.
15. The method of claim 14, wherein said ultrapure water comprises less than 10 ppb total organic carbon.
16. The method of claim 15, wherein said ultrapure water comprises less than 10 ppb dissolved silica.
17. The method of claim 16, wherein said ultrapure water contains less than 500 ppb dissolved oxygen.
18. The method of claim 1, wherein said stable oxide-free silicon surface is a hydrogen-terminated silicon surface.
19. The method of claim 1, wherein the cleaned silicon surface grows a native oxide of less than about 1 Å after exposure to air for more than about 5 days.
20. The method of claim 19, wherein the cleaned silicon surface grows a native oxide of less than about 1 Å after exposure to air for more than about 7 days.
21. A method of forming a stable oxide-free silicon surface of a substrate comprising a silicon surface, said method comprising:
    cleaning said silicon surface and chemically growing an oxide;
    etching the oxide with hydrofluoric acid;
    rinsing the hydrofluoric acid from the substrate; and
    drying the substrate after rinsing,
    wherein etching, rinsing and drying adds fewer than 0.032 particles/cm$^2$ having a size larger than 0.12 $\mu$m to the silicon surface.
22. The method of claim 21, wherein:
    cleaning the silicon surface comprised by contacting said substrate with an aqueous solution of ammonium hydroxide and hydrogen peroxide;
    etching the oxide comprises exposing the substrate to an aqueous solution of dilute hydrofluoric acid in an etch bath;
    rinsing comprises exposing the silicon substrate in-situ within the etch bath to ultrapure water; and
    drying comprises spin-drying the silicon substrate after rinsing.
23. The method of claim 22, wherein etching the oxide layer comprises contacting said silicon substrate with approximately 0.5% to 1.0% hydrofluoric acid by weight at 40° C. to 60° C. for greater than about 40 seconds.
24. The method of claim 22, wherein the ultrapure water is supplied at room temperature while rinsing.
25. The method of claim 22, wherein said rinsed silicon substrate is dried at approximately 400 rpm to 600 rpm with ionized purge gas at a temperature of approximately 60° C. to 80° C. for approximately 240 seconds to 480 seconds.
26. The method of claim 22, wherein said ultrapure water has a resistivity of greater than 16 M$\Omega$-cm at 25° C. comprises less than 10 parts per billion total organic carbon, comprises less than 10 parts per billion dissolved silica, and contains less than 500 parts per billion dissolved oxygen.
27. The method of claim 22, wherein etching, rinsing and drying add no net particles to the substrate.

28. A process for cleaning a silicon substrate and leaving a stable, hydrogen-terminated silicon surface thereon that grows less than about 1 Å of oxide after exposure to clean room air for greater than 3 days, comprising:
- exposing the silicon substrate to an aqueous mixture of ammonium hydroxide and hydrogen peroxide and growing an oxide on the silicon surface;
- etching the oxide from the silicon substrate after with a hydrofluoric acid solution in a wet bath;
- rinsing the hydrofluoric acid solution from the substrate in situ within the wet bath; and
- spin-drying the substrate after rinsing.

29. The process of claim 28, wherein etching, rinsing and drying adds fewer than 0.032 particles/cm$^2$ having a size larger than 0.12 μm to the silicon surface.

30. The process of claim 28, wherein etching and rinsing employ ultrapure water have a resistivity of greater than about 16 MΩ-cm at 25° C. and less than 10 pbb total organic carbon.

31. The process of claim 30, wherein the silicon surface grows less than about 1 Å of oxide after exposure to clean room air for greater than 7 days.

32. The process of claim 28, wherein spin-drying is conducted under heat and ionized purge gas.

* * * * *